United States Patent
Cheng et al.

(10) Patent No.: US 12,495,722 B2
(45) Date of Patent: Dec. 9, 2025

(54) SUPPRESSION OF VOID-FORMATION OF PCM MATERIALS

(71) Applicant: International Business Machines Corporation, Armonk, NY (US)

(72) Inventors: Cheng-Wei Cheng, White Plains, NY (US); Robert L. Bruce, White Plains, NY (US); Matthew Joseph BrightSky, Armonk, NY (US); Gloria Wing Yun Fraczak, Queens, NY (US)

(73) Assignee: International Business Machines Corporation, Armonk, NY (US)

( * ) Notice: Subject to any disclaimer, the term of this patent is extended or adjusted under 35 U.S.C. 154(b) by 805 days.

(21) Appl. No.: 17/457,750

(22) Filed: Dec. 6, 2021

(65) Prior Publication Data

US 2023/0180636 A1    Jun. 8, 2023

(51) Int. Cl.
*H10N 70/00* (2023.01)
*H10B 63/00* (2023.01)
*H10N 70/20* (2023.01)

(52) U.S. Cl.
CPC .......... *H10N 70/023* (2023.02); *H10B 63/80* (2023.02); *H10N 70/063* (2023.02); *H10N 70/068* (2023.02); *H10N 70/231* (2023.02); *H10N 70/841* (2023.02); *H10N 70/883* (2023.02)

(58) Field of Classification Search
CPC ...... H10B 63/80; H10B 63/10; H10N 70/063; H10N 70/883; H10N 70/023
See application file for complete search history.

(56) References Cited

U.S. PATENT DOCUMENTS

| | | | |
|---|---|---|---|
| 9,627,612 B2 | 4/2017 | BrightSky | |
| 10,141,503 B1 | 11/2018 | BrightSky | |
| 10,825,514 B2 | 11/2020 | Kim | |
| 2015/0179706 A1 | 6/2015 | Rocklein | |
| 2015/0287916 A1 | 10/2015 | Campbell | |
| 2019/0214560 A1* | 7/2019 | BrightSky | H10N 70/068 |
| 2020/0135807 A1 | 4/2020 | Brew | |
| 2020/0136043 A1* | 4/2020 | Ok | H10B 63/30 |
| 2021/0328139 A1* | 10/2021 | Lee | H10N 70/8828 |

OTHER PUBLICATIONS

Brightsky et al., "Crystalline-as-deposited ALD phase change material confined PCM cell for high density storage class memory," International Electron Devices Meeting, IEDM, 2015 IEEE Xplore, Downloaded Oct. 20, 2021, 4 Pgs.

Kim et al., "A Phase Change Memory Cell With Metallic Surfactant Layer As A Resistance Drift Stabilizer." International Electron Devices Meeting, IEDM, 2013, Downloaded Oct. 20, 2021, 4 Pgs.

\* cited by examiner

*Primary Examiner* — Mounir S Amer
(74) *Attorney, Agent, or Firm* — Michael O'Keefe

(57) ABSTRACT

A bottom electrode is deposited on a substrate. A dielectric layer is deposited on the bottom electrode. One or more structures are patterned within the dielectric layer. A liner layer is deposited on top of the dielectric layer and the bottom electrode. A selectivity promotion layer is deposited on top of the liner layer. The selectivity promotion layer is etched to expose a top surface of the dielectric layer and a portion of the bottom electrode. A phase change memory material layer is deposited within a void of the one or more structures between the selectivity promotion layer.

8 Claims, 3 Drawing Sheets

SUPPRESSION OF VOID-FORMATION OF PCM MATERIALS

BACKGROUND OF THE INVENTION

The present invention relates generally to the field of phase change memory devices and more particularly to suppression of void-formation of phase change memory materials growth in trenches or holes.

Phase Change Memory (PCM) devices are non-volatile memory devices in which the state of the memory elements can be retained for days to decades without power consumption. Examples of volatile memory devices include Dynamic Random-Access Memory (DRAM) and Static Random-Access Memory (SRAM); where DRAM requires the memory element to be constantly refreshed while SRAM requires a constant supply of energy to maintain the state of the memory element.

With phase change memory, information is stored in materials that can be manipulated into different phases. Each of these phases exhibit different electrical properties which can be used for storing information. The amorphous and crystalline phases are typically two phases used for bit storage (0's and 1's) since they have detectable differences in electrical resistance. Specifically, the amorphous phase has a higher resistance than the crystalline phase.

SUMMARY

Embodiments of the present invention provide a method for forming a semiconductor structure. In an embodiment, a bottom electrode is deposited on a substrate. A dielectric layer is deposited on the bottom electrode. One or more structures are patterned within the dielectric layer. A liner layer is deposited on top of the dielectric layer and the bottom electrode. A selectivity promotion layer is deposited on top of the liner layer. The selectivity promotion layer is etched to expose a top surface of the dielectric layer and a portion of the bottom electrode. A phase change memory material layer is deposited within a void of the one or more structures between the selectivity promotion layer.

Embodiments of the present invention provide for a semiconductor structure. In an embodiment, a bottom electrode is on top of a substrate. A patterned dielectric layer is on top of the bottom electrode. The patterned dielectric layer includes one or more structures. A liner layer is on either sidewall of each structure of the one or more structures. A selectivity promotion layer is on either each liner layer on either sidewall of each structure of the one or more structures. A phase change memory material layer is within the one or more structures between the selectivity promotion layer on either sidewall of each structure of the one or more structures.

Embodiments of the present invention provide a method for forming a semiconductor structure. A selectivity promotional layer is deposited to cover two sidewalls of each structure of one or more structures within a dielectric layer. The one or more structures are selected from the group consisting of a via and a hole. The selectivity promotion layer is thin enough to provide growth selectivity but not affect a current conduction. A phase change memory material layer is deposited within a void of the one or more structures between the selectivity promotion layer. The phase change memory material growth starts from the bottom of each structure of the one or more structures

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 2:
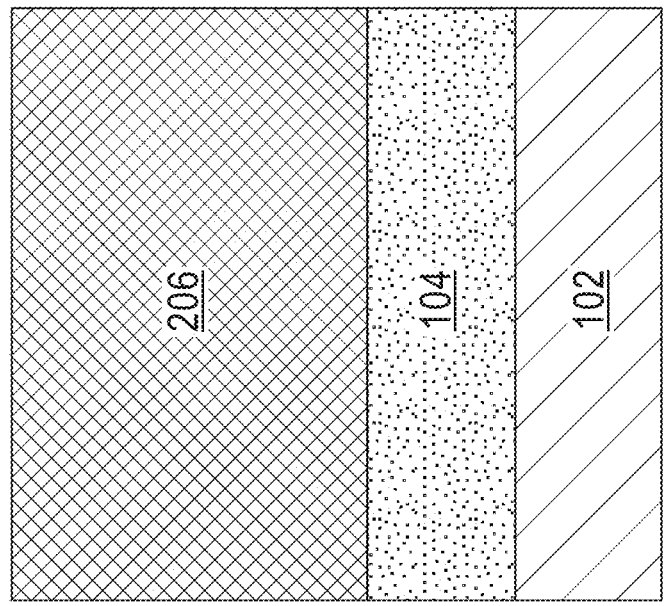
FIG. 2 depicts a cross-sectional view of the semiconductor structure after depositing a dielectric layer on top of bottom electrode in accordance with a first embodiment of the present invention.

Embodiments of the present invention recognize that phase change memory (PCM) is a proven candidate for storage class memory. Embodiments of the present invention recognize that resistance drift is still an issue in PCM materials in the reset (amorphous) state for long term data stability in multi-bit applications. Embodiments of the present invention recognize that void formation occurs after annealing of as-deposit amorphous PCM materials due to density change that is not controllable. Embodiments of the present invention recognize that void formation occurs during crystalline PCM material growth due to random nucleation on exposed surfaces. Embodiments of the present invention recognize that selective growth is feasible because PCM materials prefer to nucleate and grow on metal nitride surfaces and that removal of a metal nitride layer on the surface and exposed dielectric layers would encourage growth starting inside the trenches or holes.

Embodiments of the present invention use a selectivity promotion layer to cover sidewalls of trenches or holes to create a selective environment to initiate growth starting from the bottom of the trenches or holes to avoid nucleation on the sidewalls. Embodiments of the present invention provide for a selectivity promotion layer that is thin enough to provide growth selectivity but not affect the current conduction.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

FIGS. 1-6 depict a structure and method of suppression of void-formation of phase change memory materials growth in trenches or holes. It should be noted, FIGS. 1-6 show a single trench. In other embodiments, not shown, this method may be applied to one or more trenches and/or one or more holes.

Figure 1:
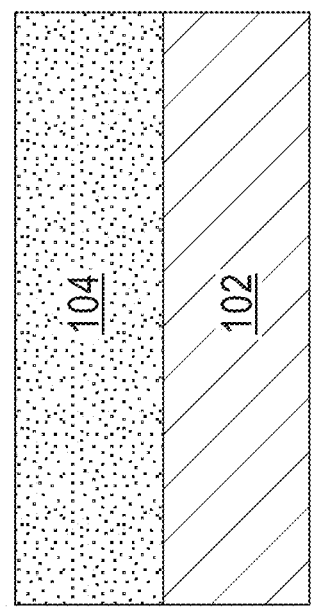
FIG. 1 depicts a cross-sectional view of the semiconductor structure after depositing a bottom electrode on top of the substrate in accordance with a first embodiment of the present invention.

FIG. 1 depicts a cross-sectional view of the semiconductor structure 100 after depositing a bottom electrode 104 on top of the substrate 102 in accordance with a first embodiment of the present invention. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, substrate 102 may be a level of interconnect wiring. For example, modern semiconductor chips may have fifteen or more levels of interconnect wiring, labeled M1-M15, so if this structure was to be used at the M2 metal level, in other words M2 metal level as substrate 102, then the M1 metal level would be located below it. Bottom electrode 104 may be formed of any conductive material used in semiconductor chip electrodes. In an embodiment bottom electrode 104 is formed by deposition of a conductive metallic material on top of substrate 102. The conductive metallic material that provides the bottom electrode 10 may include, but is not limited to, copper (Cu), titanium nitride (TiN), tungsten (W), tungsten nitride (WN), tungsten carbide (WC), silver (Ag), gold (Au), aluminum (Al) or multilayered stacks thereof. The conductive metallic material may be formed by a deposition process such as, for example, chemical vapor deposition (CVD), physical vapor deposition (PVD), plasma enhanced CVD (PECVD), sputtering, atomic layer deposition (ALD) or plating. A planarization process or an etch back process may follow the deposition of the conductive metallic material that provides the bottom electrode 104. In various embodiments, bottom electrode 104 has a rectangular shape. Bottom electrode 104 can have numerous lengths, widths and shapes. For example, bottom electrode 104 may have a narrower width going into the drawing paper and a longer length extending into and out of the drawing paper. In an embodiment, bottom electrode 104 may range from 10 nm to 1000 nm in thickness but is not limited to this range FIG. 2 depicts a cross-sectional view of the semiconductor structure 200 after depositing a dielectric layer 206 on top of bottom electrode 104 in accordance with a first embodiment of the present invention. In an embodiment, dielectric layer 206 may be an insulator. For example, dielectric layer 206 composed of a SiN compound ($SiN_x$) such as SiN, a silicon oxide compound ($SiO_x$) such as silicon dioxide ($SiO_2$), a nitride material, a hafnium oxide ($HfO_x$) material such as $HfO_2$), or an $Al_2O_3/O_2$ multilayer material or any other material suitable known in the art. In an embodiment, the dielectric layer 206 has a thickness range of 20 nm to 100 nm but is not limited to this range.

Figure 3:
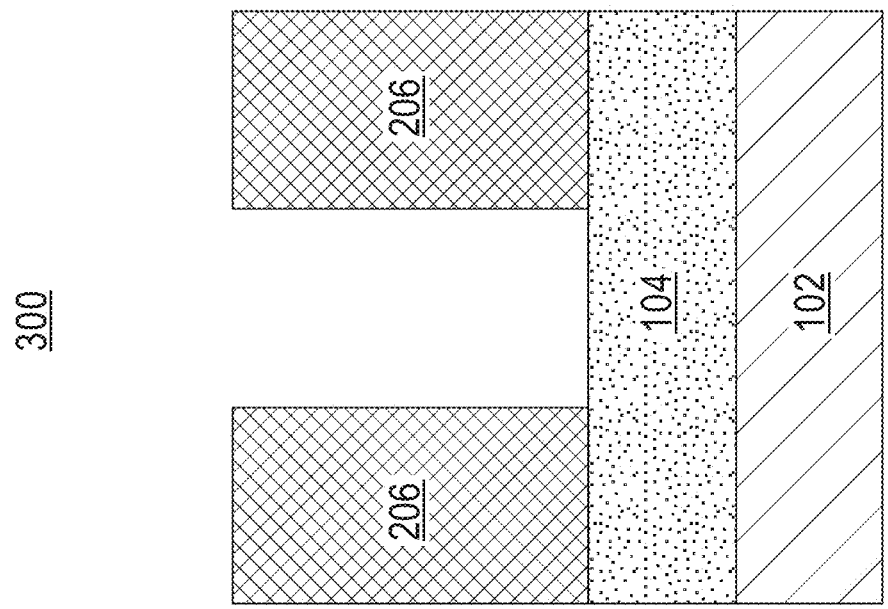
FIG. 3 depicts a cross-sectional view of the semiconductor structure after lithograph and patterning of trenches or holes into the dielectric layer in accordance with a first embodiment of the present invention.

FIG. 3 depicts a cross-sectional view of the semiconductor structure 300 after lithograph and patterning of trenches or holes into the dielectric layer 206 in accordance with a first embodiment of the present invention. In an embodiment, the patterning exposes the bottom electrode. For simplicity, a single trench is shown in semiconductor structure 300. However, any number of trenches or holes may be patterned into dielectric layer 206. Semiconductor lithography is the formation of three-dimensional relief images or patterns on the semiconductor substrate, in this case dielectric layer 206, for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Figure 4:
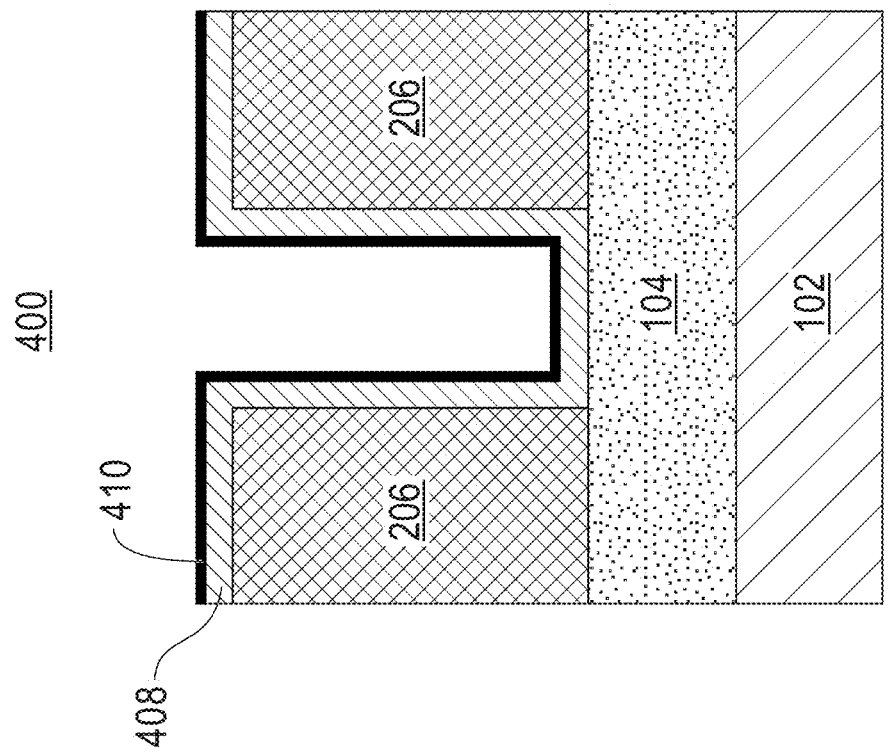
FIG. 4 depicts a cross-sectional view of the semiconductor structure after deposition of a liner layer and selectivity promotion layer on top of the dielectric layer in accordance with an embodiment of the invention.

FIG. 4 depicts a cross-sectional view of the semiconductor structure 400 after deposition of a liner layer 408 and selectivity promotion layer 410 on top of the dielectric layer 206 in accordance with an embodiment of the invention. A liner layer 408 is deposited on top of the dielectric layer 206 and the bottom electrode 104. In an embodiment, liner layer 408 may be TaN, Ta, TiN, WN, or any other material known in the art. In an embodiment, liner layer 408 is deposited via sputtering, ALD, CVD, or any other process known in the art. In an embodiment, liner layer 408 may range from 0.5 nm to 5 nm in thickness but is not limited to this range. A selectivity promotion layer 410 is deposited on top of the liner layer 408. In an embodiment, selectivity promotion layer 410 may be a SiN compound ($SiN_x$) such as SiN, a silicon oxide compound ($SiO_x$) such as silicon dioxide ($SiO_2$), or any other suitable material known in the art. In an embodiment, selectivity promotion layer 410 may range from 0.5 nm to 2 nm in thickness but is not limited to this range. In an embodiment, selectively promotion layer 410 may be thin enough for current conduction after anisotropic etch described below. In an embodiment, there might be some loss of the selectively promotion layer 410 during the selective etching process and this loss depends on the angle of the sidewall of the trench and anisotropy of etching.

Figure 5:
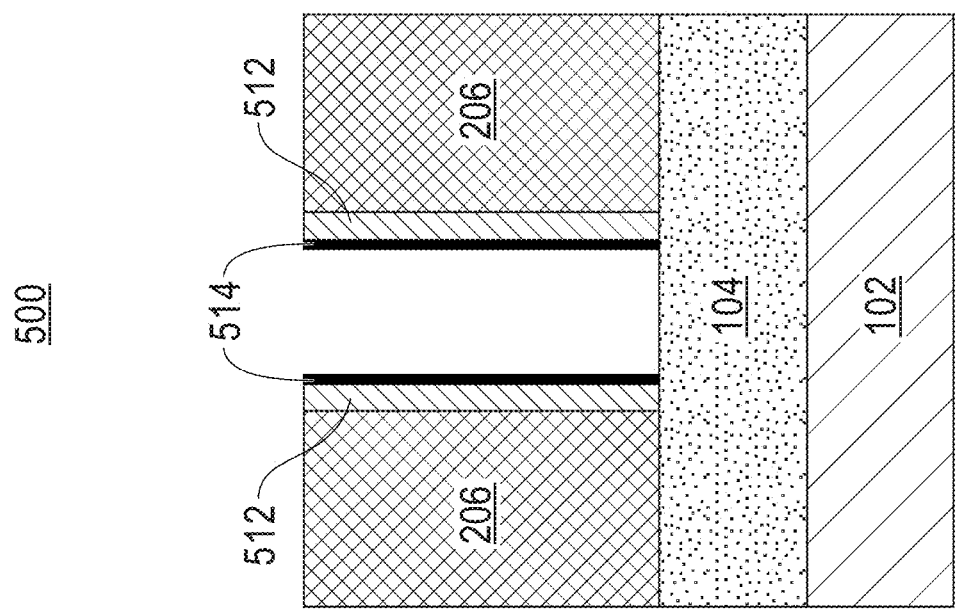
FIG. 5 depicts a cross-sectional view of the semiconductor structure after etching of the liner layer and selectivity promotion layer in accordance with a first embodiment of the present invention.

FIG. 5 depicts a cross-sectional view of the semiconductor structure 500 after etching of the liner layer 512 and selectivity promotion layer 514 in accordance with a first embodiment of the present invention. In an embodiment, liner layer 512 and selectivity promotion layer 514 are selectively removed from the surface of dielectric layer 206 and bottom electrode 104. Removal is any process such as etching or chemical-mechanical planarization ("CMP") that removes material from the wafer. In an embodiment, the removal process is a dry etch process. One example of a removal process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s). After etching, as shown in FIG. 5, the top of dielectric layer 206 is exposed and the top of bottom electrode 104 is exposed, however sidewalls of dielectric layer 206 remain covered by both liner layer 512 and selectivity promotion layer 514.

Figure 6:
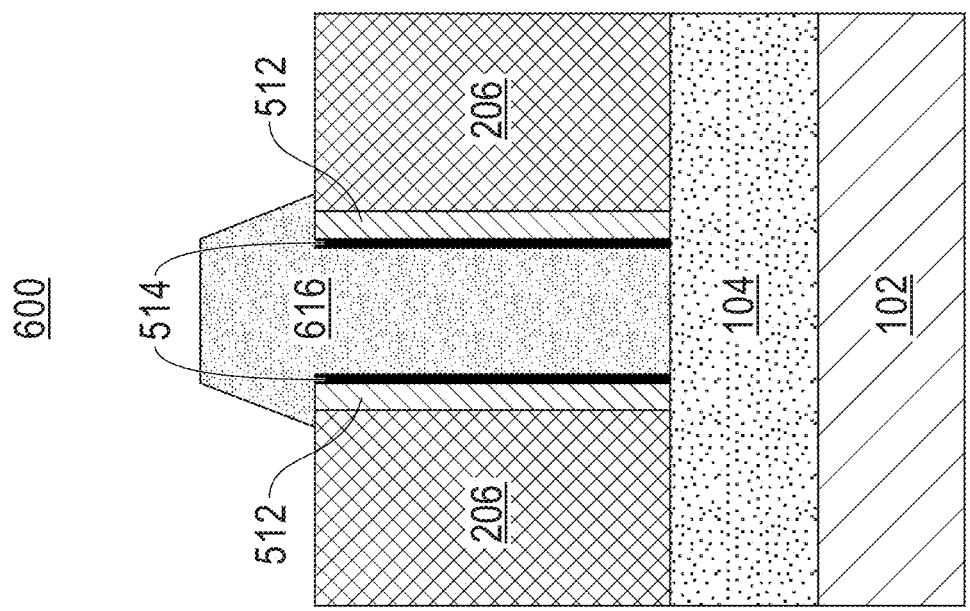
FIG. 6 depicts a cross-sectional view of the semiconductor structure after a phase change material layer growth from the exposed portions of the bottom electrode within the void between the selectivity promotion layer sidewalls.

FIG. 6 depicts a cross-sectional view of the semiconductor structure 600 after a Phase Change Memory (PCM) material layer 616 growth from the exposed portions of the bottom electrode 104 within the void between the selectivity promotion layer 514 sidewalls. The growth starts at the bottom electrode 104 and proceeds vertically. In an embodiment, PCM material layer 616 may be, but is not limited to, GeSbTe, GeTe, SbTe, SiTe, GeSbTeSe, etc. In another embodiment, PCM material layer 616 may be, but is not limited to PCM materials with some doping, for example, SiO2, SiN, Ge, Si, SiC and etc.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The methods as described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure, the semiconductor structure comprising:
    a bottom electrode directly on top of a substrate;
    a patterned dielectric layer on top of the bottom electrode, wherein the patterned dielectric layer includes one or more structures;
    a liner layer on either sidewall of each structure of the one or more structures and directly on top of a portion of the bottom electrode;

a selectivity promotion layer on either each liner layer on either sidewall of each structure of the one or more structures; and a phase change memory material layer within the one or more structures between the selectivity promotion layer on either sidewall of each structure of the one or more structures and, in a trapezoidal shape, directly on top of a frontside surface of the liner layer, a frontside surface of the selectivity promotion layer, and a portion of a frontside surface of the patterned dielectric layer.

2. The structure of claim 1, wherein the one or more structures are selected from the group consisting of a via and a hole.

3. The structure of claim 1, wherein the patterned dielectric layer has an exposed the bottom electrode within the one or more structures.

4. The structure of claim 1, wherein the selectivity promotion layer is a Silicone Nitride ($SiN_x$) compound.

5. The structure of claim 1, wherein the selectivity promotion layer is a Silicone Oxide ($SiO_x$) compound.

6. The structure of claim 1, wherein the selectivity promotion layer is greater in thickness than 0.5 nm.

7. The structure of claim 1, wherein the selectivity promotion layer is less in thickness than 2.0 nm.

8. The structure of claim 1, wherein the selectivity promotion layer avoids nucleation on two sidewalls of the one or more structures by the phase change memory material layer.

* * * * *